(12) United States Patent
Zhou et al.

(10) Patent No.: US 10,727,234 B2
(45) Date of Patent: Jul. 28, 2020

(54) LAYOUT OF SEMICONDUCTOR TRANSISTOR DEVICE

(71) Applicant: UNITED MICROELECTRONICS CORP., Hsin-Chu (TW)

(72) Inventors: Zhibiao Zhou, Singapore (SG); Ding-Lung Chen, Singapore (SG); Xing Hua Zhang, Singapore (SG); Shan Liu, Singapore (SG); Runshun Wang, Singapore (SG); Chien-Fu Chen, Miaoli County (TW); Wei-Jen Wang, Tainan (TW); Chen-Hsien Hsu, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 387 days.

(21) Appl. No.: 15/361,479

(22) Filed: Nov. 27, 2016

(65) Prior Publication Data
US 2018/0151571 A1      May 31, 2018

(51) Int. Cl.
| | | |
|---|---|---|
| *H01L 29/76* | (2006.01) | |
| *H01L 29/94* | (2006.01) | |
| *H01L 31/062* | (2012.01) | |
| *H01L 27/11* | (2006.01) | |
| *H01L 27/092* | (2006.01) | |
| *H01L 29/06* | (2006.01) | |
| *H01L 27/02* | (2006.01) | |
| *H01L 21/8238* | (2006.01) | |

(52) U.S. Cl.
CPC ...... *H01L 27/1104* (2013.01); *H01L 27/0207* (2013.01); *H01L 27/092* (2013.01); *H01L 29/0649* (2013.01); *H01L 21/823871* (2013.01)

(58) Field of Classification Search
CPC .............. H01L 27/0207; H01L 27/092; H01L 29/0649; H01L 21/8228; H01L 21/8238; H01L 27/0826
USPC .................................................. 257/369, 326
See application file for complete search history.

(56) References Cited

U.S. PATENT DOCUMENTS

| | | | |
|---|---|---|---|
| 6,594,813 | B1 | 7/2003 | Gandhi et al. |
| 2005/0286288 | A1* | 12/2005 | Porter .................. G11C 11/412 365/63 |
| 2010/0314685 | A1* | 12/2010 | Zhou ...................... H01L 21/84 257/350 |
| 2011/0241126 | A1 | 10/2011 | Herberholz |

(Continued)

OTHER PUBLICATIONS

Zhou, Title of Invention: Semiconductor Transistor Device and Fabrication Method Thereof, U.S. Appl. No. 15/200,000, filed Jul. 1, 2016.

*Primary Examiner* — Kimberly N Rizkallah
*Assistant Examiner* — Dilinh P Nguyen
(74) *Attorney, Agent, or Firm* — Winston Hsu

(57) ABSTRACT

The present invention provides a layout of a semiconductor transistor device including a first and a second active area, a first and a second gate, and a metal line. The first active and the second active area are extended along a first direction. The first gate and the second gate are extended along a second direction and crossed the first active area, to define two transistors. The two transistors are electrically connected with each other through a conductive layer. The metal line is disposed on the conductive layer and is electrically connected the two transistors respectively.

19 Claims, 15 Drawing Sheets

(56) References Cited

U.S. PATENT DOCUMENTS

2012/0313176 A1* 12/2012 Frohberg .......... H01L 21/76895
                                                            257/368
2014/0313817 A1* 10/2014 Lin .................... G11C 11/412
                                                            365/154
2016/0240569 A1*  8/2016 Kuo .................... H01L 27/1464

* cited by examiner

US 10,727,234 B2

1

LAYOUT OF SEMICONDUCTOR TRANSISTOR DEVICE

BACKGROUND OF THE INVENTION

1. Field of the Invention

The present invention relates generally to a layout of a semiconductor transistor device and more particularly, to a layout of a static random-access memory (SRAM) or a flip-flop device.

2. Description of the Prior Art

The trend in semiconductor technology is to construct an integrated circuit having a denser or faster semiconductor device, so that the device and circuit characteristic structure continue to shrink. In order to configure a different functional circuit for the dense semiconductor device on the integrated circuit, the semiconductor devices need to connect to each other.

Various contact structures or the interconnection structures will be formed in the fabricating process of the integrated circuit. For example, static random-access memory (SRAM) usually requires local interconnect to increase its density. SRAM uses local interconnect to electrically connect its memory storage area with its memory control area and contact plug to control its transistor. However, as dimensions of semiconductor devices continue to shrink, how to precisely form a smaller contact hole and contact plug structures on the gates or source and drain regions, and to reduce the contact resistance as much as possible, have become the tasks and challenges in the industry.

SUMMARY OF THE INVENTION

In order to solve the above-mentioned issues, the present invention provides a layout of a static random-access memory (SRAM) device, in which a conductive layer is disposed to electrically connect two different MOS transistors, thereto built the interconnection before the formation of contacts. In this way, the cell size of the SRAM device in the present invention may be sufficiently shrunk.

In order to solve the above-mentioned issues, the present invention also provides a layout of a flip-flop device, in which a conductive layer is disposed to electrically connect two different MOS transistors, thereto built the interconnection before the formation of contacts. In this way, the cell size of the flip-flop device in the present invention may be sufficiently shrunk.

To achieve the purpose described above, the present invention provides a layout of a semiconductor transistor device including a first and a second active area, a first and a second gate, and a metal line. The first active and the second active area are extended along a first direction. The first gate and the second gate are extended along a second direction and crossed the first active area, to define two transistors. The two transistors are electrically connected with each other through a conductive layer. The metal line is disposed on the conductive layer and is electrically connected the two transistors respectively.

The present invention provides a novel layout of a semiconductor transistor device, such as a SRAM device or a flip-flop device, in which a conductive layer is disposed before the formations of contacts and metal lines, and a bottom connection is formed therefore in a pre-contact level

2 to gain stronger signal. Furthermore, through disposing such conductive layer, the connection of the gates and the active areas may be further extended to the adjacent STI region, so that, the entire layout of the semiconductor transistor device can be simplified and the cell size thereof can also be shrunk as well, for example achieving about 23% shrunk.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic diagrams illustrating a layout of a SRAM device according to a first preferred embodiment of the present invention; wherein:

FIG. 1 shows a conductive layer layout of the SRAM device;

FIG. 2 shows a contact layout of the SRAM device;

FIG. 3 shows a cross-sectional view take along a cross line A-A' in FIG. 2;

FIG. 4 shows a metal line layout of the SRAM device;

FIG. 5 shows another conductive layer layout of the SRAM device; and

FIG. 6 shows another metal line layout of the SRAM device.

FIGS. 7-10 are schematic diagrams illustrating a layout of a SRAM device according to a second preferred embodiment of the present invention; wherein:

FIG. 7 shows a conductive layer layout of the SRAM device;

FIG. 8 shows a contact layout of the SRAM device;

FIG. 9 shows a metal line layout of the SRAM device;

FIG. 10 shows another contact layout and another metal line layout of the SRAM device.

FIGS. 11-15 are schematic diagrams illustrating a layout of a flip-flop device according to a preferred embodiment of the present invention; wherein:

FIG. 11 shows an opening layout of the flip-flop device;

FIG. 12 shows a cross-sectional view taken along a cross line B-B' in FIG. 11;

FIG. 13 shows a contact layout of the flip-flop device;

FIG. 14 shows a conductive layer layout of the flip-flop device;

FIG. 15 shows a metal line layout of the flip-flop device.

DETAILED DESCRIPTION

To provide a better understanding of the present invention, preferred embodiments will be described in detail. The preferred embodiments of the present invention are illustrated in the accompanying drawings with numbered elements.

Figure 1:
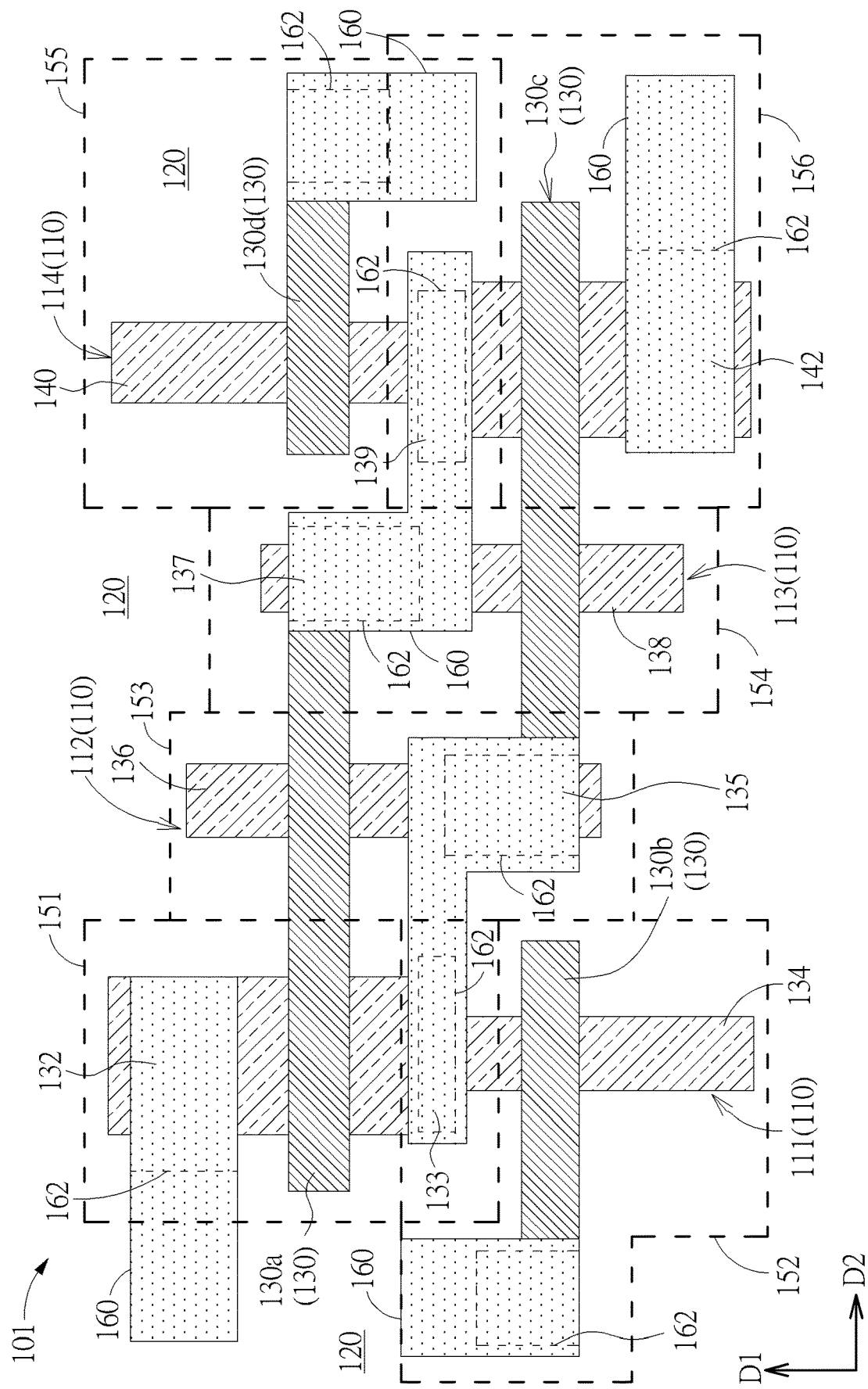
Figure 2:
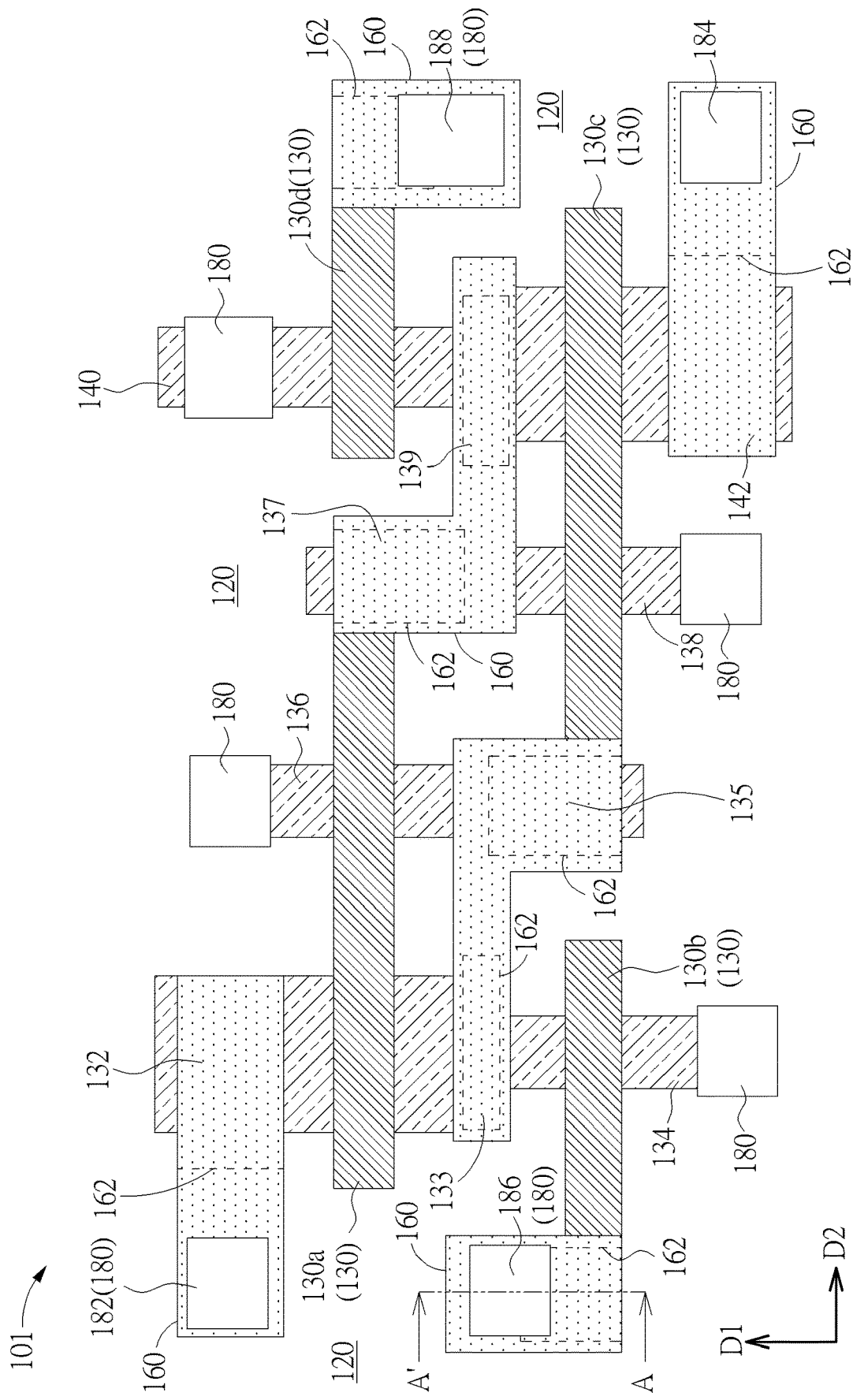
Figure 3:
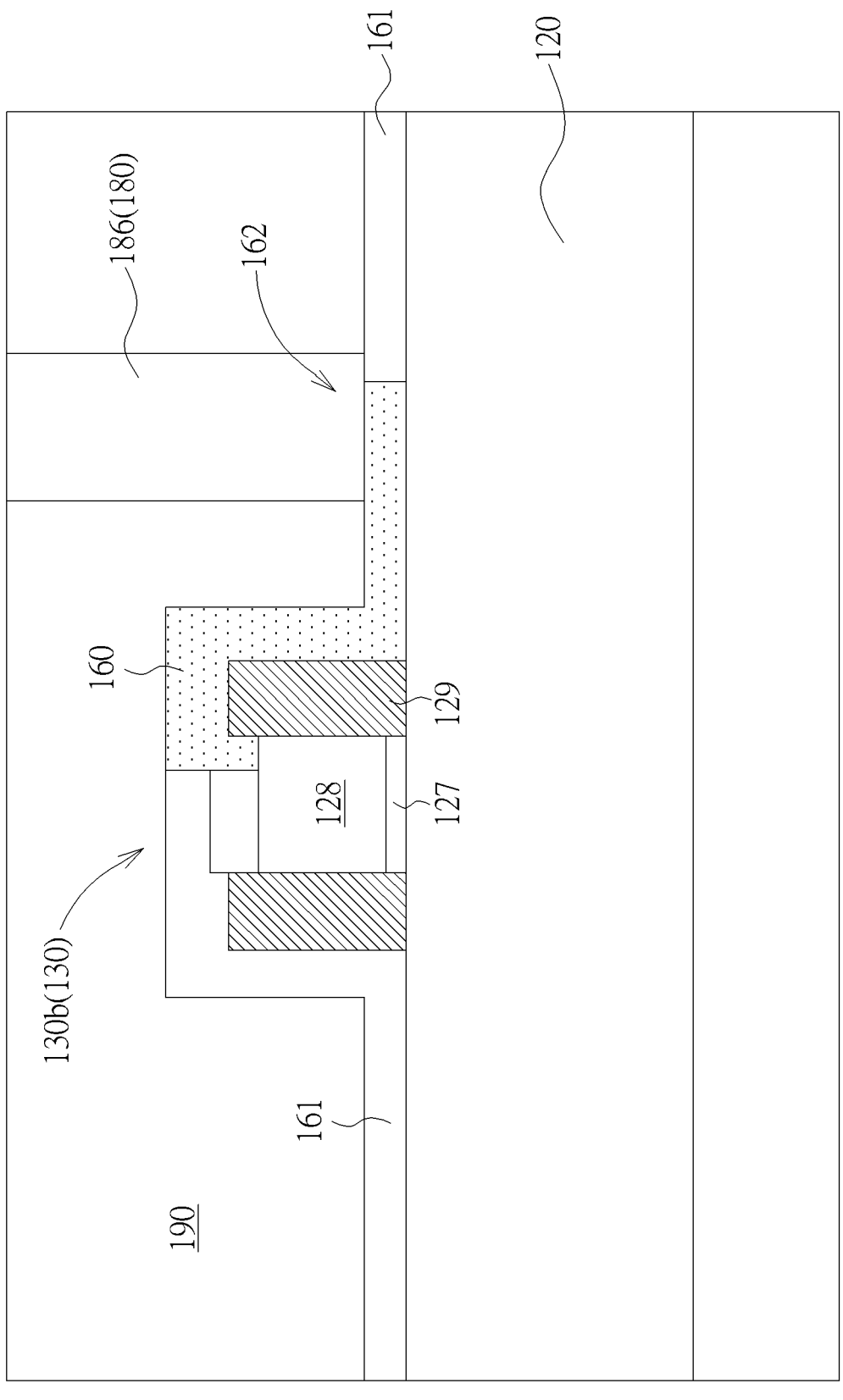

Referring to FIGS. 1-6, FIGS. 1-6 illustrate a layout of a semiconductor transistor device according to the first preferred embodiment, in which, FIG. 3 is a schematic cross-sectional view take along a cross line A-A' in FIG. 2. As shown in FIG. 1, a substrate (not shown in the drawings) such as a silicon substrate or a silicon on insulator (SOI) substrate is provided, and at least one active area 110 extended in a first direction D1, such as a y-direction, is defined on the substrate and surrounded by a shallow trench isolation (STI) area 120. Then, at least one gate 130 is disposed on the substrate and crosses the active area 110 in a second direction D2, such as a x-direction. In one embodiment, the gate 130 includes a gate dielectric layer 127, a gate electrode layer 128 and a spacer layer 129 surrounded the gate dielectric layer 127 and a gate electrode layer 128, as shown in FIG. 3.

In the present embodiment, four gates 130a, 130b, 130c, 130d are formed to cross four active areas 111, 112, 113, 114, with gates 130a, 130c simultaneous crossing two different active areas 111, 112/113, 114 to define six different MOS transistors 151, 152, 153, 154, 155, 156 as shown in FIG. 1. It is noted that, the MOS transistors 151, 152 include a shared drain region 133 and source regions 132, 134 disposed at two sides of the gates 130a, 130b respectively. Equally, the MOS transistors 155, 156 also include a shared drain region 139 and source region 140, 142 disposed at two sides of the gates 130d, 130c, as shown in FIG. 1. It is noted that the six MOS transistor 151-156 together forma memory cell such as SRAM device 101, thereto serve as the smallest unit in the SRAM array for accepting signals from a bit line and a word line subsequent formed during the operation. Precisely, the MOS transistors 153, 154 generally include p-type metal oxide semiconductor (PMOS) transistors, therefore are functioned like two pull-up MOS transistors of the SRAM device 101, the MOS transistors 151, 156 generally include n-type metal oxide semiconductors (NMOS), therefore are functioned like two pull-down MOS transistors of the SRAM device 101, and the MOS transistors 152, 155 also include NMOS transistors, therefore are functioned like two access MOS transistors of the SRAM device 101. These six MOS transistors 151-156 constitute a set of flip-flop (not shown in the drawings), wherein the pull-up MOS transistor 153 and the pull-down MOS transistor 151 constitute an inverter (not shown in the drawings), and the pull-up MOS transistor 154 and the pull-down MOS transistor 156 constitute another inverter (not shown in the drawings).

Then, an insulating cap layer 161 and a conductive layer 160 are sequentially disposed on the gates 130 or the active areas 110 to electrically connect the MOS transistors 151-156 with one another. Precisely, the formation of the conductive layer 160 includes conformally depositing the insulating cap layer 161, such as including $SiO_x$, SiN or SiON, firstly on the gates 130 and the active areas 110, and forming a plurality of openings 162 in the insulating cap layer 161, wherein the opening 162 are situated above portions of the gates 130 or the active areas 110 to expose the portions thereof. That is, the conductive layer 160 formed then may directly contact the exposed portions of the gates 130 or the active areas 110, and the connecting of the gates 130 or the active areas 110 may therefore be easily achieved through electrically connecting the conductive layer 160.

For example, the shared drain region 133 of the pull-down MOS transistor 151 and the access MOS transistor 152, a drain region 135 of the pull-up MOS transistor 153, and the gate 130c of the pull-up MOS transistor 154 and the pull-down MOS transistor 156 are connected with each other through the conductive layer 160 overlapped on top. Equally, the shared drain region 139 of the pull-down MOS transistor 156 and the access MOS transistor 155, a drain region 137 of the pull-up MOS transistor 154, and the gate 130a of the pull-up MOS transistor 153 and the pull-down MOS transistor 151 are connected with each other through the conductive layer 160 overlapped on top. On the other hand, the conductive layer 160 is also disposed on the gates 130b, 130d of the access MOS transistors 152, 155 and the source regions 132, 142 of the pull-down MOS transistor 151, 156 respectively, and further extended to the STI area 120 adjacent thereto, as shown in FIG. 1.

Then, an insulating layer 190 is formed to cover the conductive layer 160, and a plurality of first contacts 180 are formed in the insulating layer 190, to electrically connect the gates 130 or the active areas 110 through the conductive layer 160. In the present embodiment, the insulating layer 190 has a thickness being about 7-10 times greater than a thickness of the insulating cap layer 161 or a thickness of the conductive layer 160, and a top surface of the insulating layer 190 and a top surface of the first contacts 180 are coplanar, as shown in FIG. 3. The first contacts 180 are electrically connected to the source regions 132, 134, 136, 138, 140, 142 of the six MOS transistors 151-156 respectively and the gates 130b, 130d, as shown in FIG. 2. It is noted that, since the conductive layer 160 is formed in previous step to build up the connection between the drain regions 133, 135 of the pull-down MOS transistor 151, the access MOS transistor 152 and the pull-up MOS transistor 153, and the gate 130c of the pull-up MOS transistor 154 and pull-down MOS transistor 156, and between the drain regions 139, 137 of the pull-down MOS transistor 156, the access MOS transistor 155 and the pull-up MOS transistor 154, and the gate 130a of the pull-up MOS transistor 153 and the pull-down MOS transistor 151, contacts are no long needed to be formed on the aforementioned drain regions 133, 135, 137, 139.

Also, with the deposition of the conductive layer 160, the first contacts 180 are not necessary to be formed directly above the gates 130 or the active areas 110 for electrically connecting thereto. For example, as shown in FIG. 3, the first contact 186 for electrically connecting the gate 130b is formed on the conductive layer 160 where over the adjacent STI area 120 instead of directly above the gates 130b. Equally, the first contacts 188 for electrically connecting the gate 130d is also formed on the adjacent STI area 120, as shown in FIG. 2. In addition, the first contact 182 is formed on the conductive layer 160 disposed on the adjacent STI area 120 for electrically connecting the source region 132 of the pull-down MOS transistor 151, and the first contact 184 is formed on the conductive layer 160 disposed on the adjacent STI area 120 for electrically connecting the source region 142 of the pull-down MOS transistor 156, as shown in FIG. 2.

Figure 4:
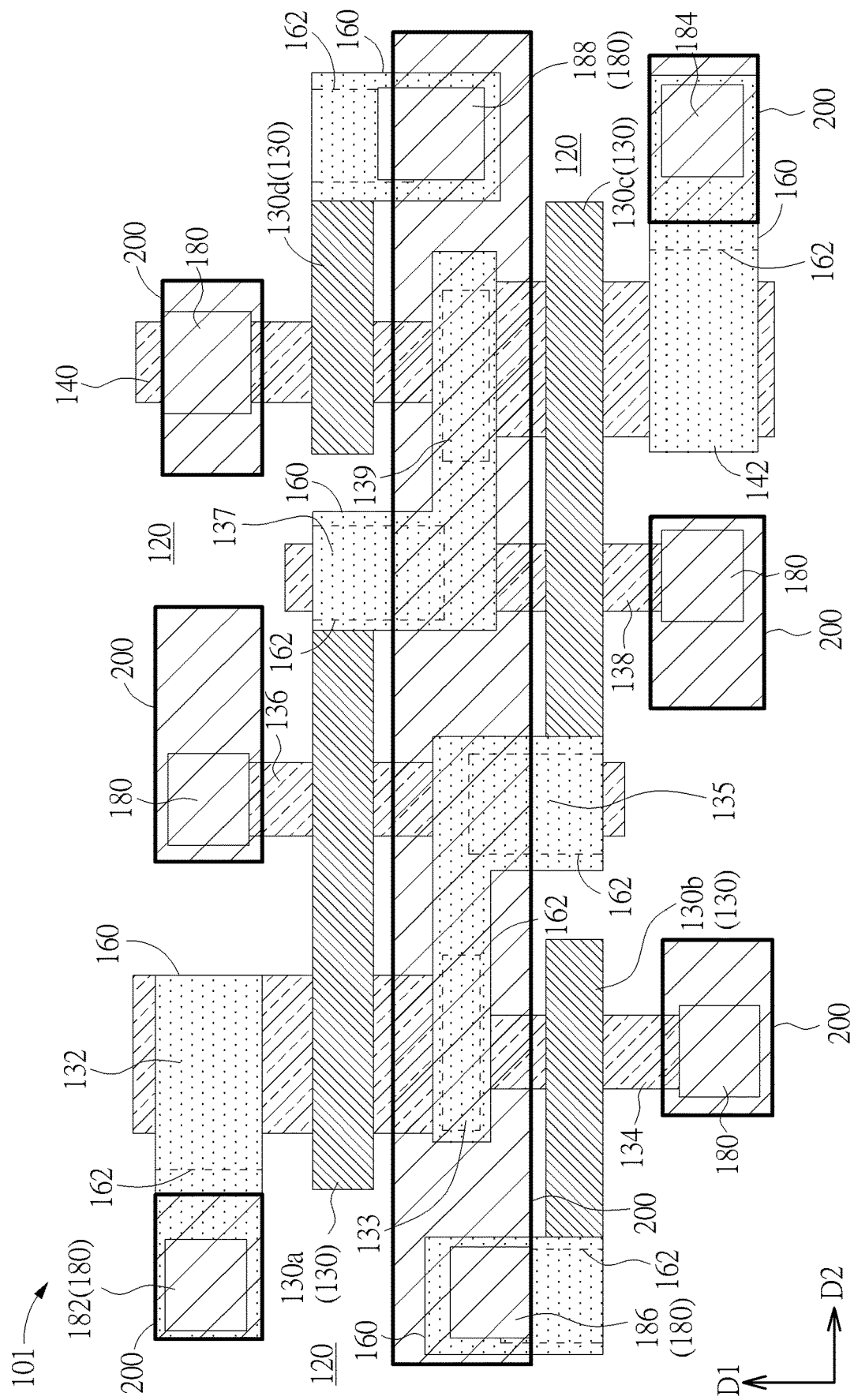

Following these, a first metal line, such as a word line 200, is formed to electrically connect the six MOS transistor 151-156 respectively through the first contacts 180. The word line 200 is formed in an insulating layer (not shown in the drawings) covered on the insulating layer 190, and is electrically connected to the source regions 132, 142 of the pull-down MOS transistors 151 156, the gates 130b, 130d and the source regions 134, 140 of the access MOS transistors 152, 155, and the source regions 136, 138 of the pull-up MOS transistors 153, 154, respectively, as shown in FIG. 4. It is noteworthy that, the sources region 134, 136, 138, 140 are electrically connected to the word line 200 only through the first contacts 180, and the source regions 132, 142 and the gates 130b, 130c are electrically connected to the word line 200 through both of the first contacts 180 and the conductive layer 160 underneath.

Figure 5:
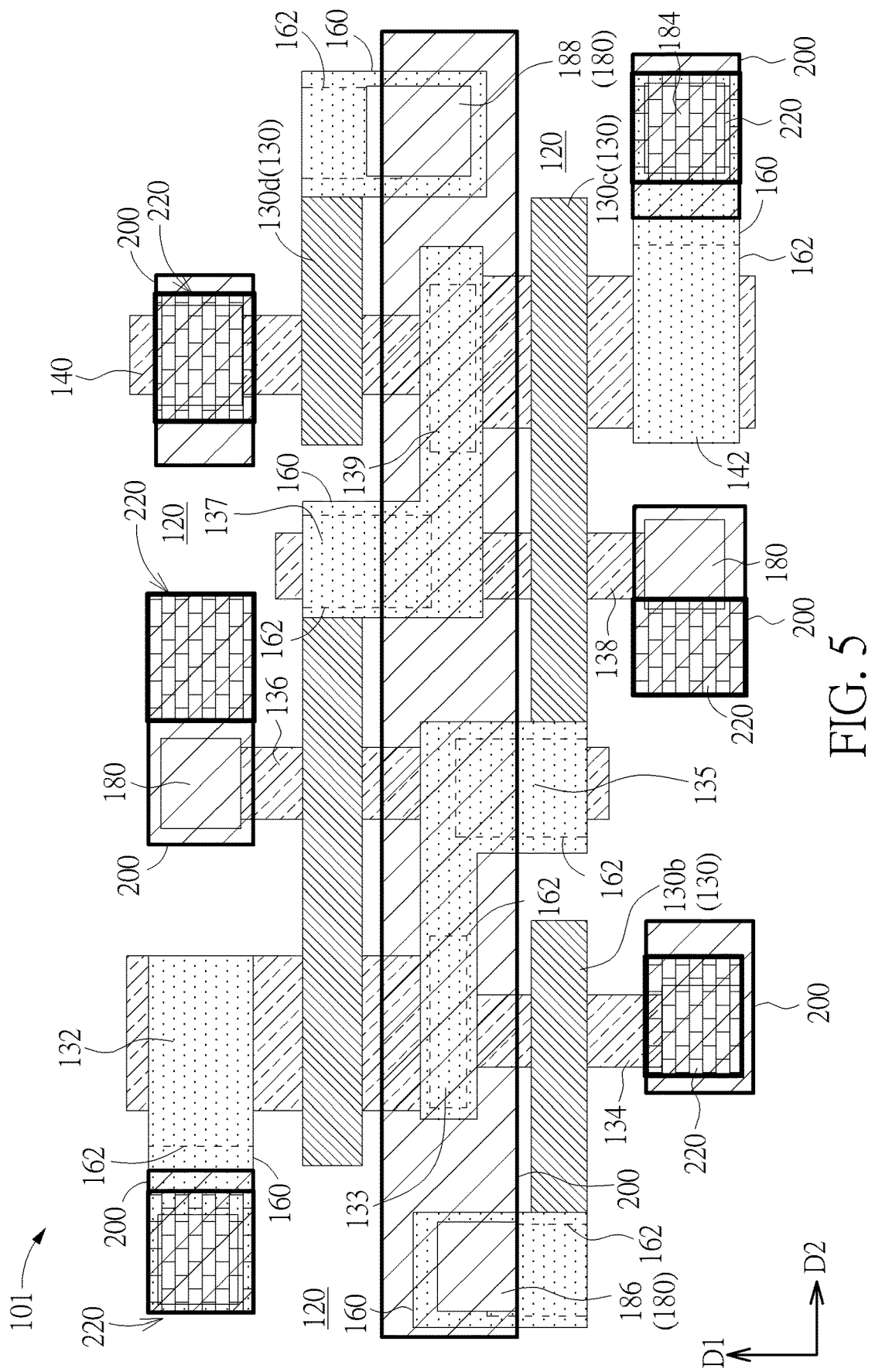

As shown in FIG. 5, a plurality of second contacts 220 is formed on the word line 200 to electrically connect thereto. The second contacts 220 are formed in another insulating layer (not shown in the drawings) covered on the metal layer 200, and the second contacts 220 are situated above the source regions 132, 134, 136, 138, 140, 142 of the six MOS transistors 151-156 to electrically connect thereto through the word line 200 and the first contacts 180 underneath.

Figure 6:
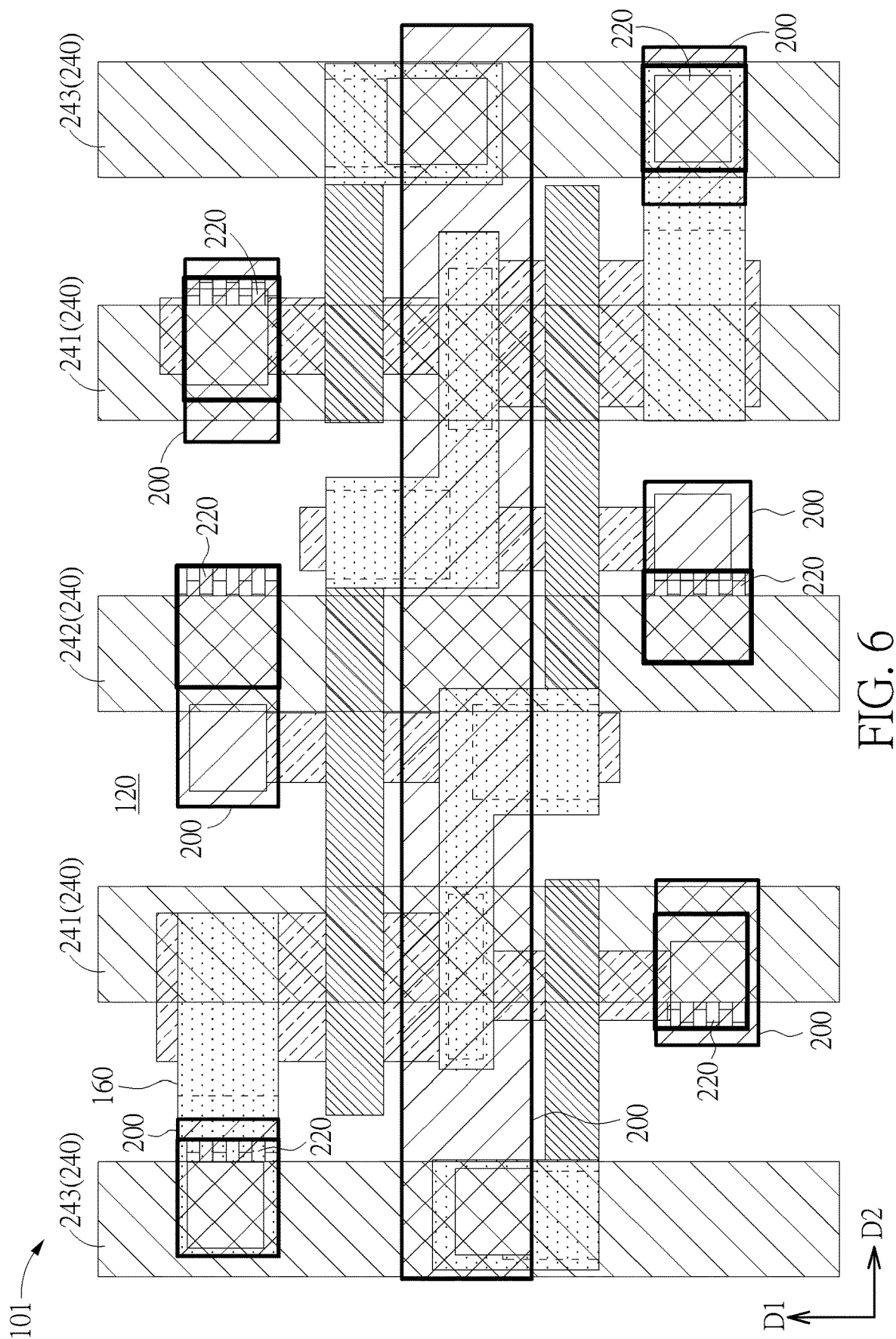

After that, a second metal layer is formed to electrically connect the MOS transistor 151-156 respectively. In the present embodiment, the second metal layer for example includes two bit lines 241, two ground lines 243 and a power line 242 extended paralleledly with one another along the first direction D1. The power line 242 is disposed between the two bit lines 241 and the two ground lines 243, and which is electrically connected to the source regions 136, 138 of the pull-up MOS transistors 153, 154 through the second contacts 220 as shown in FIG. 6. On the other hand, the bit lines 241 are electrically connected to the source regions 134, 140 of the access MOS transistors 152, 155, and the two ground lines 243 are electrically connected to the source regions 132, 142 of the pull-down MOS transistor 151, 156, respectively, also through the second contacts 220, as shown in FIG. 6.

According to the present embodiment, a layout of the SRAM device 101 is provided, in which the interconnection between the drain regions 133, 135 of the pull-down MOS transistor 151, the access MOS transistor 152 and the pull-up MOS transistor 153, and the gate 130c of the pull-up MOS transistor 154 and pull-down MOS transistor 156, and between the drain regions 139, 137 of the pull-down MOS transistor 156, the access MOS transistor 155 and the pull-up MOS transistor 154, and the gate 130a of the pull-up MOS transistor 153 and the pull-down MOS transistor 151, are previously formed before the formation of the first contacts 180, via the conductive layer 160. Then, the rest interconnection is subsequently formed through the contacts 180, 220 and the metal lines 200, 240. In the SRAM device 101, the inverter constituted by the pull-up MOS transistor 153 and the pull-down MOS transistor 151 is connected to the power line 242 and the ground line 243 through the source regions 136, 132 of the pull-up MOS transistors 153 and the pull-down MOS transistor 151. Equally, the inverter constituted by the pull-up MOS transistor 154 and the pull-down MOS transistor 156 is also connected to the power line 242 and the ground line 243 through the source regions 138, 142 of the pull-up MOS transistors 154 and the pull-down MOS transistor 156.

In other words, the interconnection of the SRAM device 101 in the present embodiment is partially achieved in a pre-contact level, with disposing the conductive layer 160 to directly in contact with the gates 130 or the active areas 110. For example, the gate 130a of the pull-up MOS transistors 153 and the pull-down MOS transistor 151 are connected to the shared drain region 139 of the access MOS transistor 155 directly through the conductive layer 160 shown in FIG. 1, and equally, the gate 130c of the pull-up MOS transistors 154 and the pull-down MOS transistor 156 are connected to the shared drain region 133 of the access MOS transistor 152 also through the conductive layer 160 shown in FIG. 1. Thus, the number of the subsequent formed contacts can be reduced, thereto gain increased process window for the contact arrangement. On the other hand, through disposing such conductive layer 160, partial gates 130 and active areas 110 are allow to be extended to the adjacent STI area 120. That is, the connecting of such gates 130 or the active areas 110 may be easily achieved through electrically connecting the conductive layer 160. Then, the first contacts 180 for electrically connecting thereto are allowable to be formed accordingly on the adjacent STI area 120, such that, the dimensions of the gates 130 and the active area 110 can therefore be reduced sufficiently. In this way, the entire layout of the SRAM device 101 may be simplified and the cell size thereof may be effectively reduced as well, for example achieving about 20% shrunk.

The following description will detail the different embodiments of a layout of MOS transistor in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
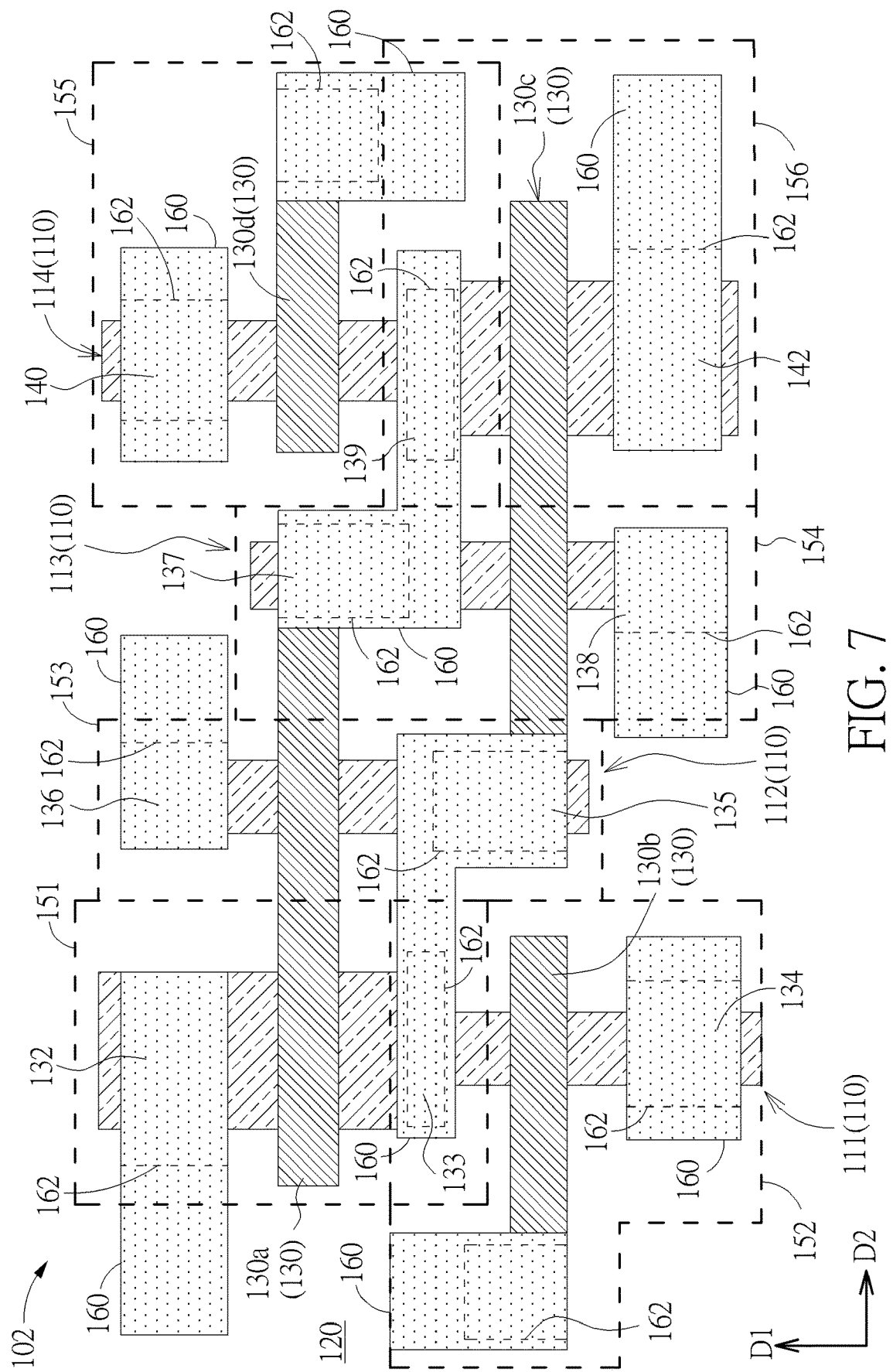

Referring to FIGS. 7-10, a layout of a semiconductor transistor device according to the second preferred embodiment is provided. The layout of the semiconductor transistor device in the present embodiment is substantially similar to that of the SRAM device 101 in above embodiment, and which includes the active areas 110 defined on the substrate, the STI area 120 surrounded the active areas 110 on the substrate, and the gates 130 across the active areas 110. The difference between the present embodiment and the aforementioned first preferred embodiment is in that, the conductive layer 160 is also disposed on the sources regions 136, 138 of the pull-up MOS transistors 153, 154 and the source regions 134, 140 of the access MOS transistors 152, 155, and further extended to the adjacent STI area 120, as shown in FIG. 7.

Figure 8:
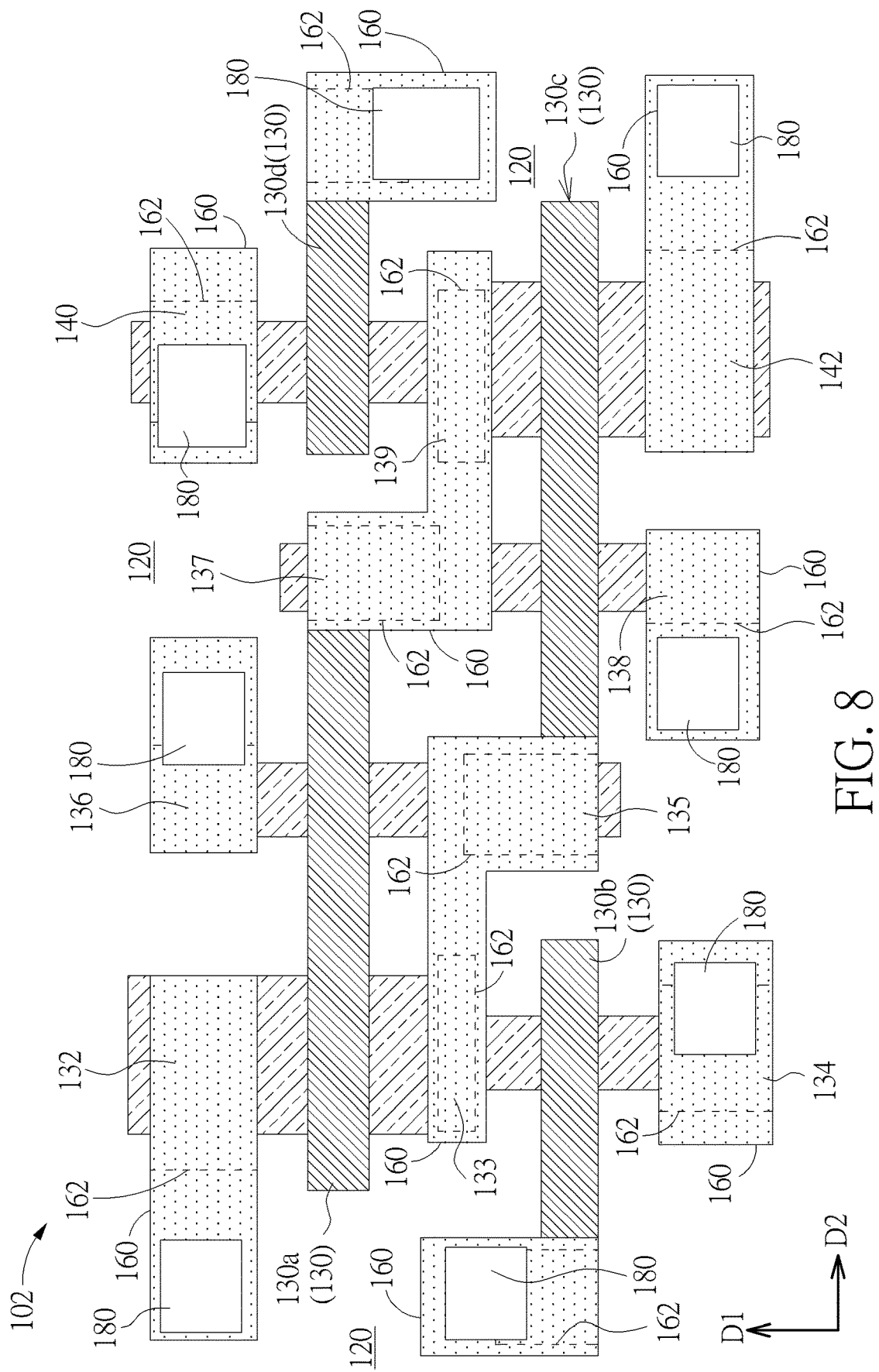

Then, the first contacts 180 formed subsequently on the sources regions 134, 136, 138, 140 for electrically connecting thereto are also allowed to be formed at least partially on the STI are 120 adjacent to the sources regions 134, 136, 138, 140, as shown in FIG. 8. That is, although not being formed on the sources regions 134, 136, 138, 140, the first contacts 180 may still electrically connect those sources regions 134, 136, 138, 140 through the conductive layer 160 disposed on the sources regions 134, 136, 138, 140.

Figure 9:
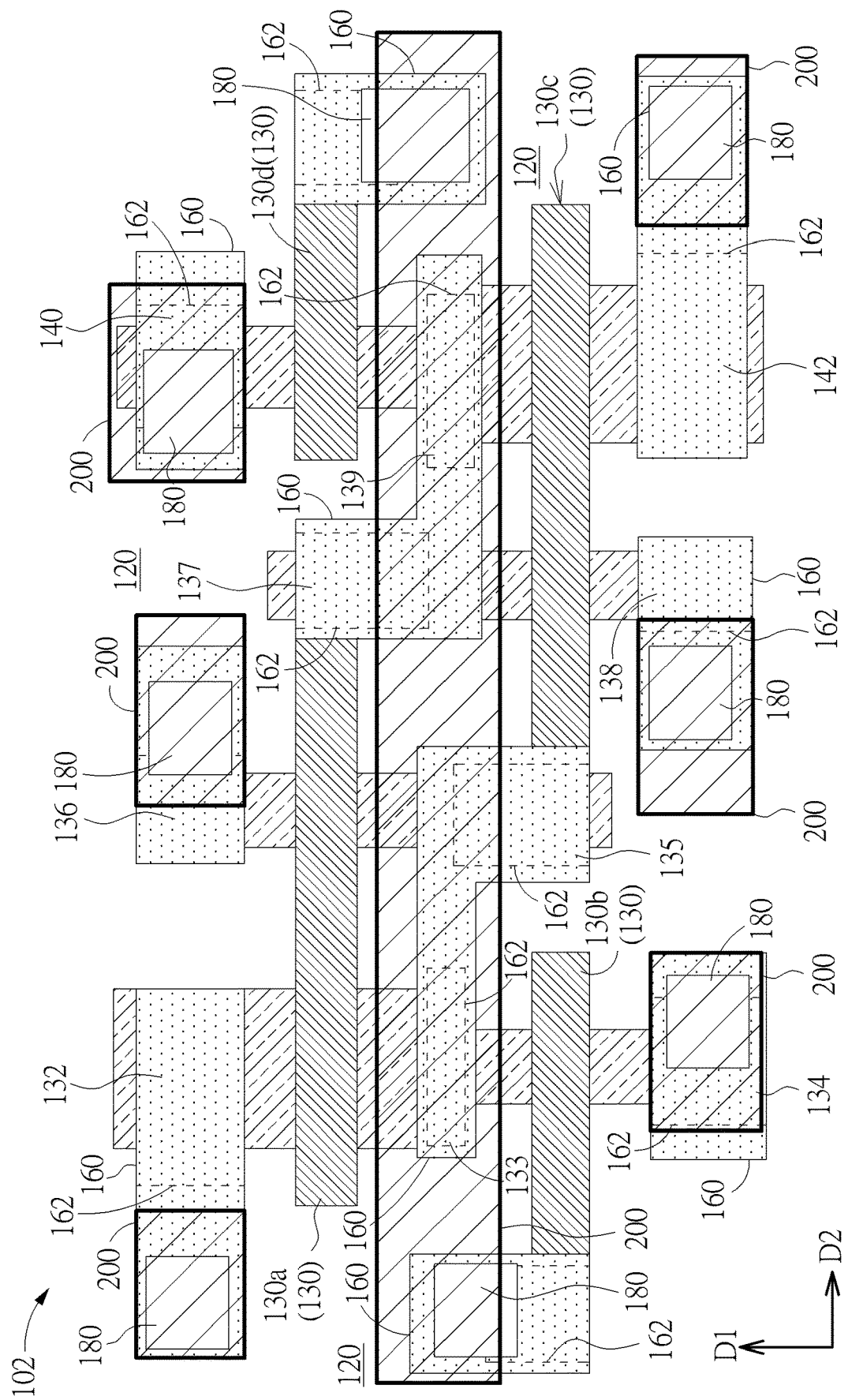

Following these, the first metal line, such as the word line 200, and the second metal lines, such as the bit lines 241, the ground lines 243 and the power line 242 are formed sequentially on the first contacts. Similarly, the word line 200 is formed in the insulating layer covered on the first contacts 180, and is electrically connected to the source regions 132, 142 of the pull-down MOS transistors 151, 156, the gate 130b, 130c and the source region 134, 140 of the access MOS transistors 152, 155, and the source regions 136, 138 of the pull-up MOS transistor 153, 154, respectively, as shown in FIG. 9. It is noteworthy that, the sources regions 132, 134, 136, 138, 140, 142 of the six MOS transistors 151-156 are all electrically connected to the word line 200 through the first contacts 180 and the conductive layer 160 underneath.

Figure 10:
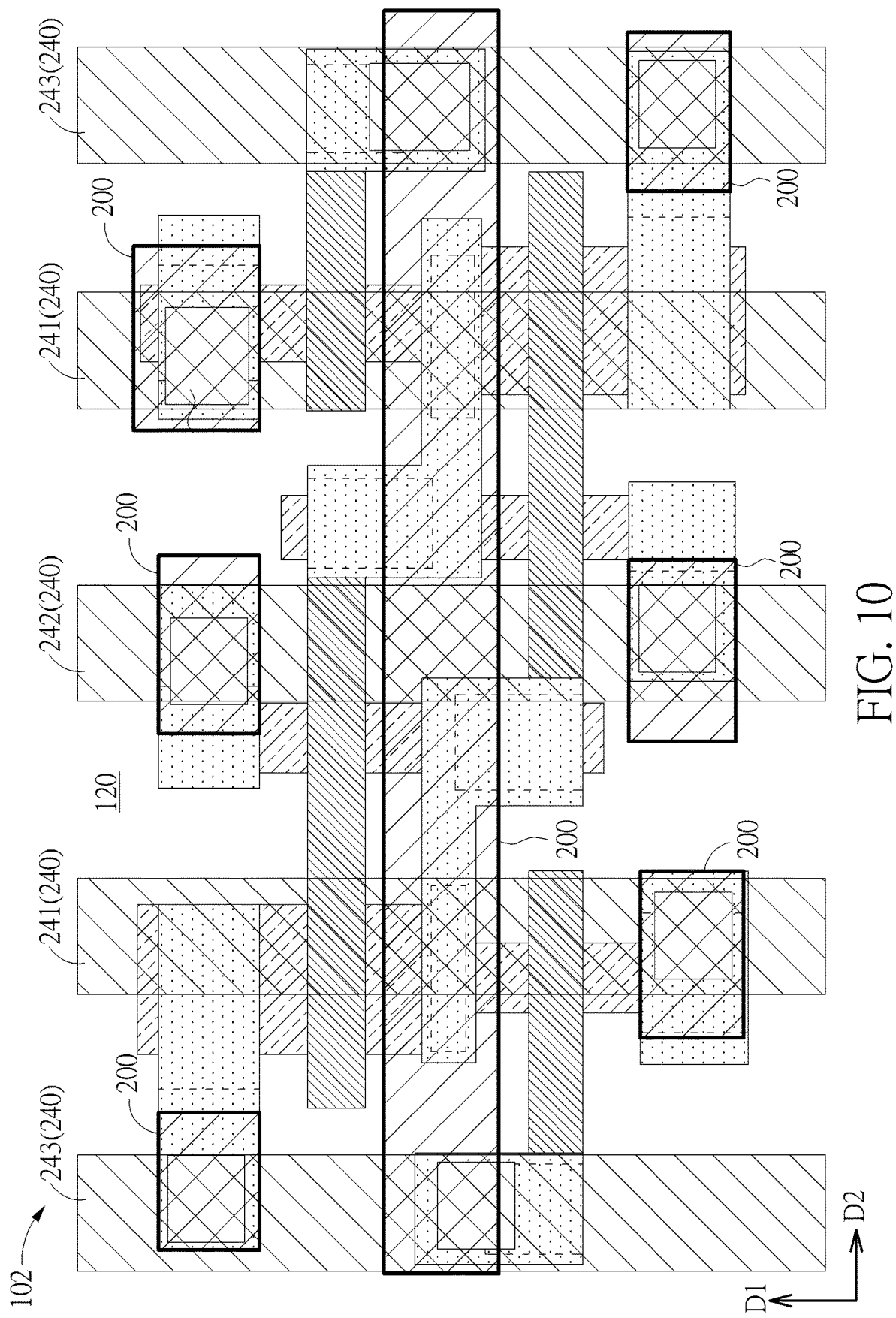

On the other hand, the bit lines 241, the ground lines 243 and the power line 242 are also formed in another insulating layer covered on the word lines 200, with the power line 242 electrically connecting the source regions 136, 138 of the pull-up MOS transistors 153, 154, with the bit lines 241 electrically connecting the source regions 134, 140 of the access MOS transistors 152, 155, and with the two ground lines 243 electrically connecting to the source regions 132, 142 of the pull-down MOS transistor 151, 156, through a plurality of second contacts (not shown in the drawings) disposed underneath, as shown in FIG. 10.

Through the aforementioned arrangement, a layout of the SRAM device 102 shown in FIG. 10 is provided, in which the interconnection thereof is still partially achieved in a pre-contact level, with disposing the conductive layer 160 to directly in contact with the gates 130 or the active area 110. Thus, the number of the subsequent formed contacts can be reduced, thereto gain increased process window for the contact arrangement. On the other hand, through disposing such conductive layer 160, the gates 130 and the active area 110 are all allow to be extended to the adjacent STI area 120. That is, the connecting of such gates 130 or the active areas 110 may be easily achieved through electrically connecting the conductive layer 160. Then, the first contacts 180 for electrically connecting thereto are allowable to be formed accordingly on the adjacent STI area 120, such that, the dimensions of the gates 130 and the active area 110 can therefore be reduced sufficiently. In this way, the entire layout of the SRAM device 102 may be simplified and the cell size thereof may be effectively reduced as well, for example achieving about 20% shrunk.

Figure 11:
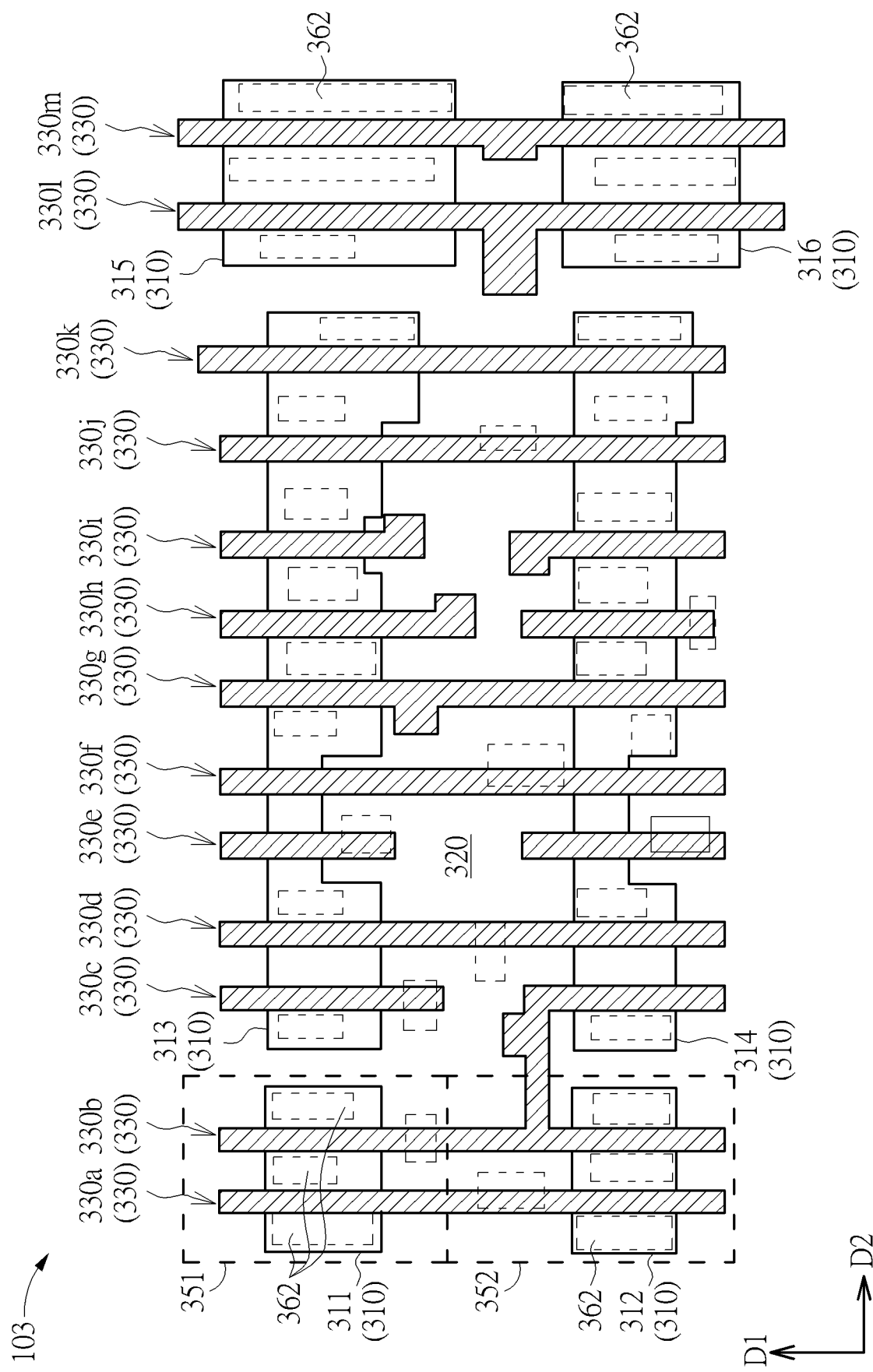
Figure 12:
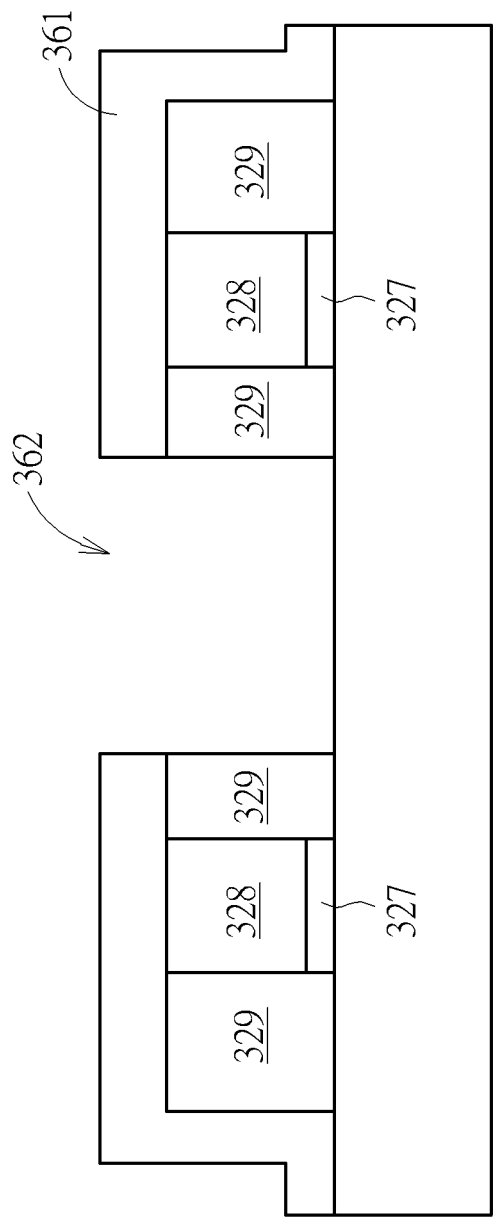

Referring to FIGS. 11-15, FIGS. 11-15 illustrate a layout of another semiconductor transistor device according to the preferred embodiment, in which, FIG. 12 is a schematic cross-sectional view take along a cross line B-B' in FIG. 11. As shown in FIG. 11, a substrate (not shown in the drawings) such as a silicon substrate or a silicon on insulator (SOI) substrate is provided, and at least one active area 310 is defined on the substrate and surrounded by a shallow trench isolation (STI) area 320. Then, at least one gate 330 is disposed on the substrate and crosses the active area 310 in the first direction D1, such as a x-direction. In one embodiment, the gate 330 includes a gate dielectric layer 327, a gate electrode layer 328 and a spacer layer 329 surrounded the gate dielectric layer 327 and a gate electrode layer 328, as shown in FIG. 12.

In the present embodiment, thirteen gates 330a-330m are formed to cross six active areas 311, 312, 313, 314, 315, 316 to define a plurality of MOS transistors (not shown in the drawings), in which gates 330c, 330e, 330h, 330i include two separated parts with the two separated parts thereof across two different active areas 313, 314, and gates 330b, 330c are in connect with each other, as shown in FIG. 11. It is noted that the MOS transistors constituted by the gates 330 and active areas 311, 313, 315 includes a plurality of NMOS transistors, the MOS transistors constituted by the gates 330 and active areas 312, 314, 316 315 includes a plurality of PMOS transistors, and the NMOS transistors and the PMOS transistors together form a plurality inverters (not shown in the drawings). For example, a NMOS transistor 351 and a PMOS transistor 352 shown in FIG. 11 together forms an inverter. That is, the layout of the present embodiment may form a flip-flop device 103, thereto serve a latch circuit during the operation.

Then, a conductive layer 360 is disposed on the gates 330 or the active areas 310 to electrically connect the MOS transistors with one another. Precisely, the formation of the conductive layer 360 includes conformally depositing an insulating cap layer 361, such as including $SiO_x$, SiN or SiON, on the gates 330 and the active areas 310, and forming a plurality of openings, such as an opening 362 shown in FIGS. 11-12, in the insulating cap layer 361. In one embodiment, the spacer layer 329 preferably includes a material having etching selectivity related to that of the insulating cap layer 361, such as a high temperature oxide (HTO) layer, so that, the openings such as the opening 362 may be defined by performing an etching process with an etchant specifically for etching the insulating cap layer 361 (such as SiN), like CH based etchant including $CH_2F_2/CH_3F$ for example.

Figure 13:
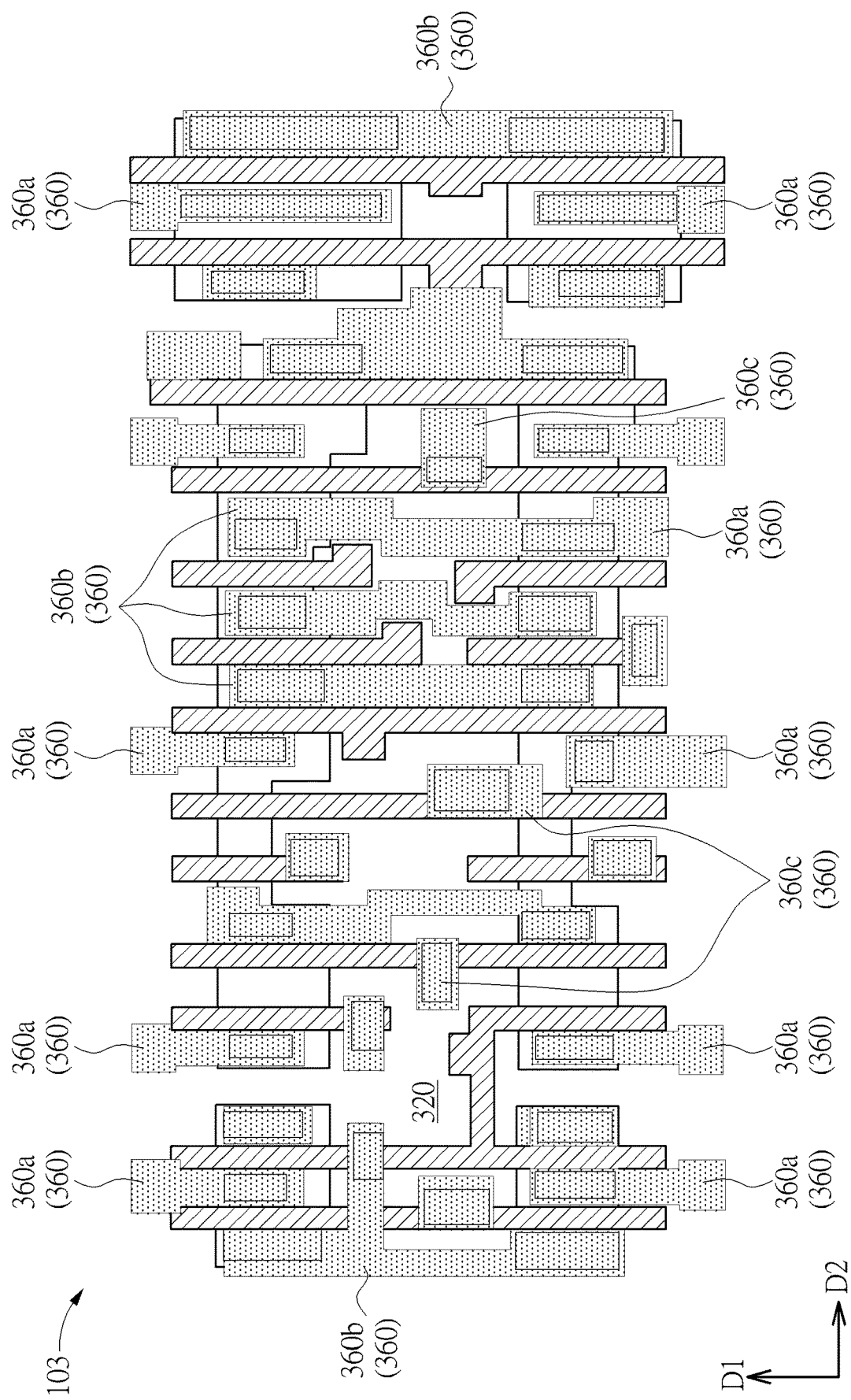

In the present embodiment, the opening 362 are situated above portions of the gates 330 or the active areas 310 to expose the portions thereof. That is, the conductive layer 360 formed then on the insulating layer 361 may directly contact the exposed portions of the gates 330 or the active areas 310, and electrically connect the gates 330 or the active areas 310 with one another. For example, as shown in FIG. 13, a source region (not shown in the drawings) and the gates 330a, 330b of the NMOS transistor 351 are connected to the source region (not shown in the drawings) and the gate 330c through the conductive layer 360b overlapped on top. Equally, other source regions or the gates 330 may also be connected to each other through the conductive layer 360b overlapped on top. On the other hand, the conductive layer 160a is also disposed on drain regions (not shown in the drawings) of the NMOS transistor 351 and the PMOS 352, respectively, and further extended to the STI area 320 adjacent thereto, as shown in FIG. 13. Also, partial gates 330, such as the gates 330c-e, 330h, 330j, 330i may also be extended to the adjacent STI area 320 respectively through the conductive layer 360c overlapped on top, as shown in FIG. 13.

Figure 14:
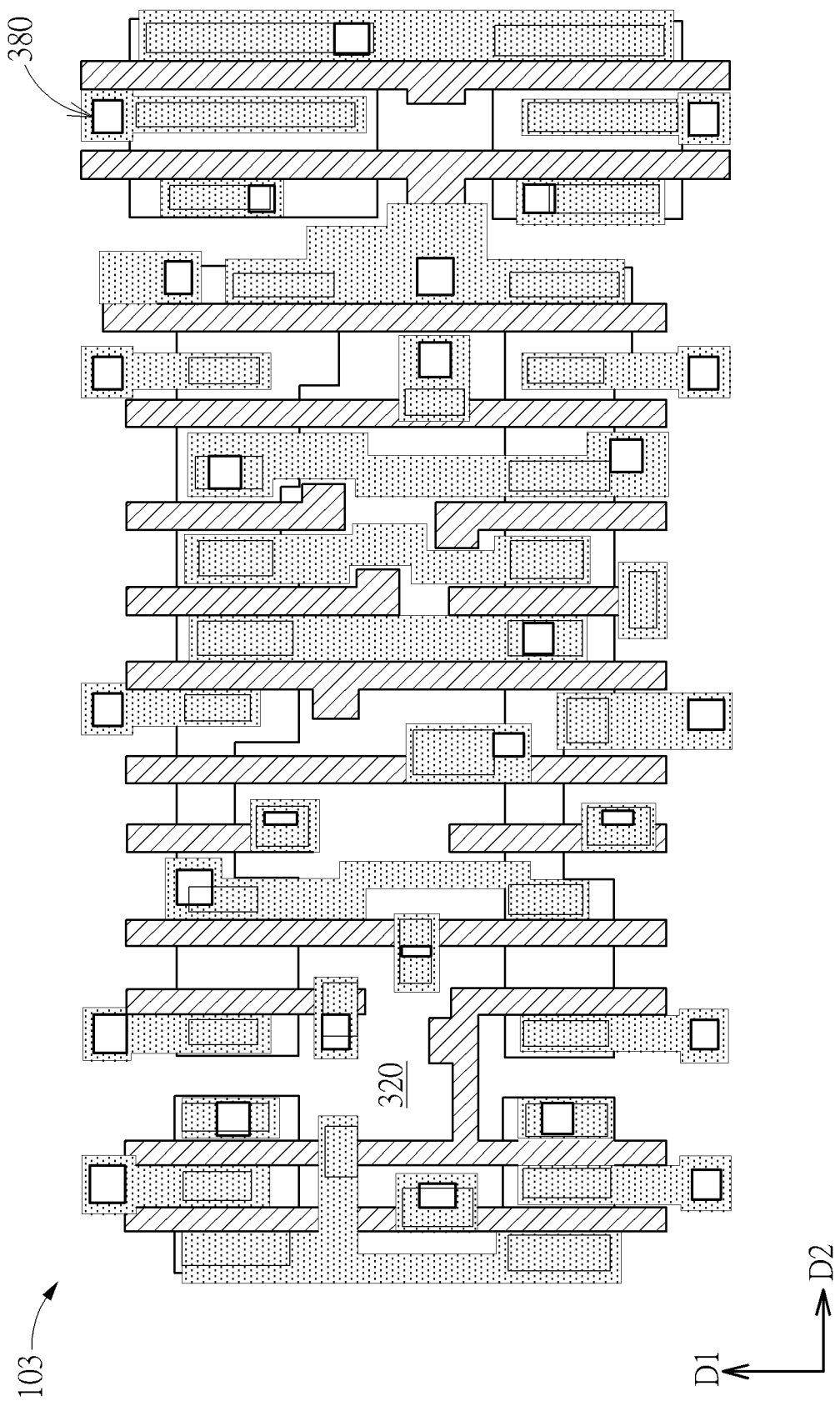

Then, as shown in FIG. 14, a plurality of contacts 380 are formed on the conductive layer 360 to electrically connect the MOS transistors through the conductive layer 360. In the present embodiment, the contacts 380 are formed in an insulating layer (not shown in the drawings) covered on the conductive layer 360 and the insulating layer 361, wherein the insulating layer has a thickness being about 7-10 times greater than a thickness of the insulating cap layer 361, and a top surface of the insulating layer and a top surface of the contacts 380 are preferably coplanar. In the present embodiment, the contacts are electrically connected to the drain regions and the gates 330 of each MOS transistor respectively. It is noted that, since the conductive layer 360a is formed in previous step to build up the basic connection between the NMOS transistors and the PMOS transistors, such as the connection between the source region and the gates 330a, 330b of the NMOS transistor 351, and the source region and the gate 330c of the PMOS transistor 352, contacts are no long needed to be formed on the aforementioned source regions, as shown in FIG. 14.

Also, with the deposition of the conductive layer 360a, 360c, the contacts 380 are not necessary to be formed directly above the gates 330 or the active areas 310 for electrically connecting thereto. For example, the contacts 180 for electrically connecting the gates 330c-e, 330h, 330j, 330i or the drain regions of the NMOS transistor 351 and the PMOS transistor 352 are formed on the conductive layer 160 where over the adjacent STI area 320 instead of directly above the gates 330c-e, 330h, 330j, 330i or the drain regions.

Figure 15:
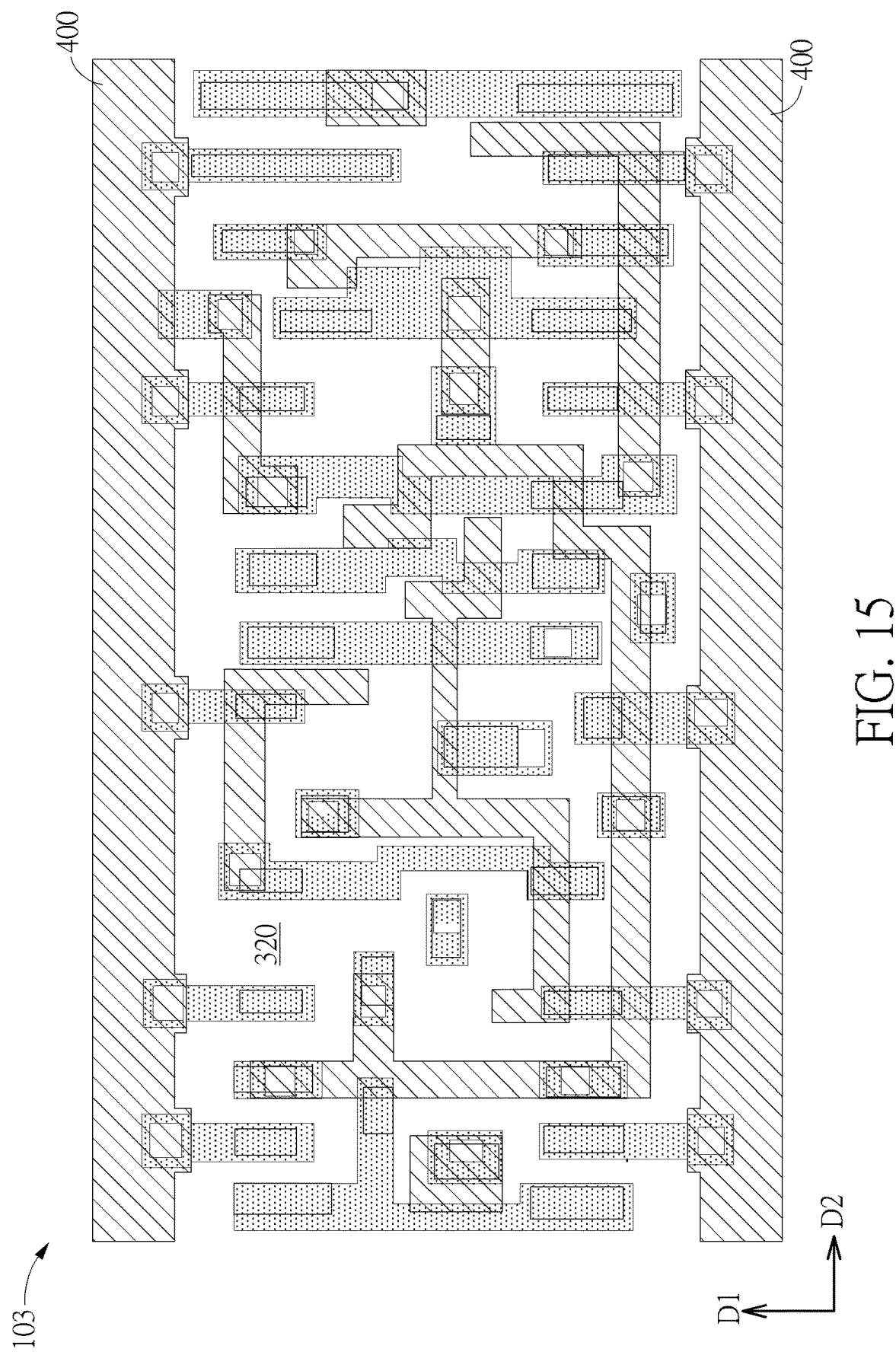

Following these, a plurality of metal lines 400 is formed to electrically the MOS transistors respectively through the contacts 380. The metal lines 400 are formed in another insulating layer (not shown in the drawings) covered on the aforementioned insulating layer, and are electrically connected to the drain regions and the gates 300 of the MOS transistors respectively. The metal lines for example includes two power lines, such as a high voltage terminal 401 and a ground terminal 402, extended in the second direction D2, the two power lines are disposed at two sides of the active areas 310 and no overlapped with any active area 310, as shown in FIG. 15. In the present embodiment, a portion of the drain regions of the MOS transistors (such as the drain region of the NMOS transistor 351) are connected to the high voltage terminal 401, and another portion of the drain regions (such as the drain region of the PMOS transistor 352) of the MOS transistors are connected to the ground terminal 402.

According to the present embodiment, a layout of the flip-flop device 103 is provided, in which the interconnection between the sources regions and the gates of the PMOS transistor and the NMOS transistor are previously formed before the formation of the contacts 380, via the conductive layer 360. Then, the rest interconnection is subsequently formed through the contacts 380 and the metal lines 400. In the flip-flop device 103, the inverter constituted by the NMOS transistor 351 and the PMOS transistor 352 is connected to the high voltage terminal 401 and the ground terminal 402 through the drain regions of the NMOS transistors 351 and the PMOS transistor 352.

In other words, the interconnection of the flip-flop device 103 in the present embodiment is partially achieved in a pre-contact level, with disposing the conductive layer 360 to directly in contact with the gates 330 or the active areas 310. Thus, the number of the subsequent formed contacts 380 can be reduced, thereto gain increased process window for the contact arrangement. Also, the interconnection in the pre-contact level may achieve stronger signal accordingly. On the other hand, through disposing such conductive layer 360, partial gates 330 and active areas 310 are allow to be extended to the adjacent STI area 320. That is, the contacts 380 for electrically connecting thereto may be formed accordingly on the adjacent STI area 320 and electrically connect the gates 330 and the active area 310 through the conductive layer 360. In this way, the entire layout of the flip-flop device 103 may be simplified and the cell size thereof may be effectively reduced as well, for example achieving about 23% shrunk.

Overall, the present invention provides a novel layout of the semiconductor transistor device, such as a SRAM device or a flip-flop device, in which a conductive layer is disposed before the formations of contacts and metal lines, and a bottom connection is formed therefore in a pre-contact level to gain stronger signal. Furthermore, through disposing such conductive layer, the connection of the gates and the active areas may be further extended to the adjacent STI region, so that, the entire layout of the semiconductor transistor device can be simplified and the cell size thereof can also be shrunk as well, for example achieving about 20%-23% shrunk.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout of a semiconductor transistor device, comprising:
    a first active area and a second active area extended along a first direction;
    a shallow trench isolation, surrounded the first active area and the second active area;
    a first gate and a second gate extended along a second direction, across the first active area and the second active area to define two transistors, wherein the two transistors are electrically connected with each other through a conductive layer and the conductive layer is extended from the two transistors to directly contact the shallow trench isolation, wherein the two transistors comprise a drain region respectively, and the drain regions of the two transistors are electrically connected with each other through the conductive layer, the conductive layer is disposed directly on a top surface of the shallow trench isolation; and
    a metal line disposed on the conductive layer, the metal line electrically connected the two transistors respectively.

2. The layout of a semiconductor transistor device of claim 1, wherein the two transistors together form an inverter.

3. The layout of a semiconductor transistor device of claim 1, wherein the two transistors comprise a PMOS transistor and a NMOS transistor.

4. The layout of a semiconductor transistor device of claim 1, wherein the two transistors comprise an access transistor and a pull-up transistor.

5. The layout of a semiconductor transistor device of claim 1, wherein the second gate also across the first active area to define another transistor, and a drain region of the another transistor is electrically connected with the drain regions of the two transistors through the conductive layer.

6. The layout of a semiconductor transistor device of claim 5, wherein the another transistor comprises a pull-down transistor.

7. The layout of a semiconductor transistor device of claim 1, further comprising:
    a first insulating layer, the first insulating layer is disposed on the first gate, the second gate, first active area and the second active area, and the conductive layer is disposed on a first insulating layer.

8. The layout of a semiconductor transistor device of claim 7, further comprising:
    a first contact disposed on the conductive layer, and the metal line electrically connected the two transistors through the first contact.

9. The layout of a semiconductor transistor device of claim 8, wherein the first contact is disposed in a second insulating layer covered on the conductive layer, and the second insulating layer comprises a thickness greater than a thickness of the first insulating layer.

10. The layout of a semiconductor transistor device of claim 8, wherein the two transistors comprise a source region respectively, and the source regions of the two transistors are electrically connected to the metal line through the first contact.

11. The layout of a semiconductor transistor device of claim 8, wherein the metal line comprises a word line.

12. The layout of a semiconductor transistor device of claim 8, wherein the first contact is disposed on the conductive layer disposed on the shallow trench isolation.

13. The layout of a semiconductor transistor device of claim 1, wherein the two transistors comprises a pull-down transistor and a pull-up transistor.

14. The layout of a semiconductor transistor device of claim 1, wherein the two transistors comprise a source region respectively, and the source regions of the two transistors, the first gate and the second gate are electrically connected with each other through the conductive layer.

15. The layout of a semiconductor transistor device of claim 1, further comprising:
    a second contact disposed on the conductive layer, wherein the two transistors comprise a drain region respectively, and the drain regions of the two transistors are electrically connected to the metal line respectively through the second contact.

16. The layout of a semiconductor transistor device of claim 15, wherein the second contact is disposed on the conductive layer on the shallow trench isolation.

17. The layout of a semiconductor transistor device of claim 15, wherein the metal line comprises a power line or a ground line.

18. The layout of a semiconductor transistor device of claim 1, further comprising:
    a third gate, across a third active area, wherein the third gate connects the second gate.

19. The layout of a semiconductor transistor device of claim 1, wherein the conductive layer has an L-shape under a top view for overlapping the drain regions of the two transistors.

* * * * *